(12) United States Patent　　(10) Patent No.:　US 12,696,709 B2
Ogata　　(45) Date of Patent:　Jul. 28, 2026

(54) SUBSTRATE PROCESSING METHOD, SUBSTRATE PROCESSING APPARATUS, AND COMPUTER-READABLE RECORDING MEDIUM

(71) Applicant: Tokyo Electron Limited, Tokyo (JP)

(72) Inventor: Tsunemoto Ogata, Koshi City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 273 days.

(21) Appl. No.: 18/252,796

(22) PCT Filed: Nov. 2, 2021

(86) PCT No.: PCT/JP2021/040371
§ 371 (c)(1),
(2) Date: May 12, 2023

(87) PCT Pub. No.: WO2022/102469
PCT Pub. Date: May 19, 2022

(65) Prior Publication Data
US 2024/0001410 A1　Jan. 4, 2024

(30) Foreign Application Priority Data
Nov. 16, 2020　(JP) ................................ 2020-190303

(51) Int. Cl.
*H10P 70/00*　(2026.01)
*H10P 72/00*　(2026.01)
(52) U.S. Cl.
CPC ...... *H10P 72/0411* (2026.01); *H10P 72/0406* (2026.01); *H10P 70/00* (2026.01)
(58) Field of Classification Search
None
See application file for complete search history.

(56) References Cited

U.S. PATENT DOCUMENTS

2016/0214148 A1* 7/2016 Okutani ............ H01L 21/67017
2018/0345315 A1* 12/2018 Tanaka ................... B05D 1/005

FOREIGN PATENT DOCUMENTS

JP　2012-146951 A　8/2012
JP　2015-126194 A　7/2015
(Continued)

OTHER PUBLICATIONS

International Search Report for PCT/JP2021/040371 dated Dec. 28, 2021.

*Primary Examiner* — Kaj K Olsen
*Assistant Examiner* — Ryan L Coleman
(74) *Attorney, Agent, or Firm* — Chrisman Gallo Tochtrop LLC

(57) ABSTRACT

A substrate processing method includes forming, by supplying a cleaning liquid, a liquid film of the cleaning liquid on the substrate; forming, by supplying a rinse liquid, a liquid film of the rinse liquid on the substrate, after the forming of the liquid film of the cleaning liquid; forming, by supplying a first organic solvent, a liquid film of the first organic solvent on the substrate, after the forming of the liquid film of the rinse liquid; forming, by supplying a second organic solvent, a liquid film of the second organic solvent on the substrate, after the forming of the liquid film of the first organic solvent; and drying the substrate after the forming of the liquid film of the second organic solvent. The second organic solvent has water solubility lower than that of the first organic solvent and a boiling point higher than that of the first organic solvent.

18 Claims, 9 Drawing Sheets

(56)           References Cited

FOREIGN PATENT DOCUMENTS

| JP | 2018-026520 | A |   | 2/2018 |
|----|-------------|---|---|--------|
| JP | 2018-206851 | A |   | 12/2018 |
| JP | 2018206851 |   | * | 12/2018 |
| JP | 2019-121709 | A |   | 7/2019 |
| JP | 2019-121710 | A |   | 7/2019 |
| KR | 10-2016-0091281 | A |   | 8/2016 |
| KR | 10-2020-0099595 | A |   | 8/2020 |

* cited by examiner

SUBSTRATE PROCESSING METHOD, SUBSTRATE PROCESSING APPARATUS, AND COMPUTER-READABLE RECORDING MEDIUM

CROSS-REFERENCE TO RELATED APPLICATIONS

This Application is a U.S. national phase application under 35 U.S.C. § 371 of PCT Application No. PCT/JP2021/040371 filed on Nov. 2, 2021, which claims the benefit of Japanese Patent Application No. 2020-190303 filed on Nov. 16, 2020, the entire disclosures of which are incorporated herein by reference.

TECHNICAL FIELD

The various aspects and embodiments described herein pertain generally to a substrate processing method, a substrate processing apparatus, and a computer-readable recording medium.

BACKGROUND

Patent Document 1 describes a processing method including a process of supplying a processing liquid to a substrate, a process of heating the substrate on which a liquid film of the processing liquid is formed, a process of supplying a volatile processing liquid to the substrate, and a process of drying the substrate by removing the volatile processing liquid. The heating process includes heating the substrate so that the surface temperature of the substrate becomes higher than a dew point temperature before the surface of the substrate is exposed from the volatile processing liquid.

Patent Document 1: Japanese Patent Laid-open Publication No. 2012-146951

SUMMARY

In an exemplary embodiment, a substrate processing method may include forming, by supplying a cleaning liquid to a substrate while rotating the substrate, a liquid film of the cleaning liquid on the substrate; forming, by supplying a rinse liquid to the substrate while rotating the substrate, a liquid film of the rinse liquid on the substrate and removing the cleaning liquid from the substrate, after the forming of the liquid film of the cleaning liquid; forming, by supplying a first organic solvent to the substrate while rotating the substrate, a liquid film of the first organic solvent on the substrate and removing the rinse liquid from the substrate, after the forming of the liquid film of the rinse liquid; forming, by supplying a second organic solvent to the substrate while rotating the substrate, a liquid film of the second organic solvent on the substrate and removing the first organic solvent from the substrate, after the forming of the liquid film of the first organic solvent; and drying the substrate after the forming of the liquid film of the second organic solvent. The second organic solvent may have water solubility lower than that of the first organic solvent and a boiling point higher than that of the first organic solvent.

BRIEF DESCRIPTION OF THE DRAWINGS

FIG. 2 is a side view schematically illustrating an example of a processing unit.

FIG. 3 is a block diagram illustrating an example of main parts of the substrate processing system.

DETAILED DESCRIPTION

Figure 1:
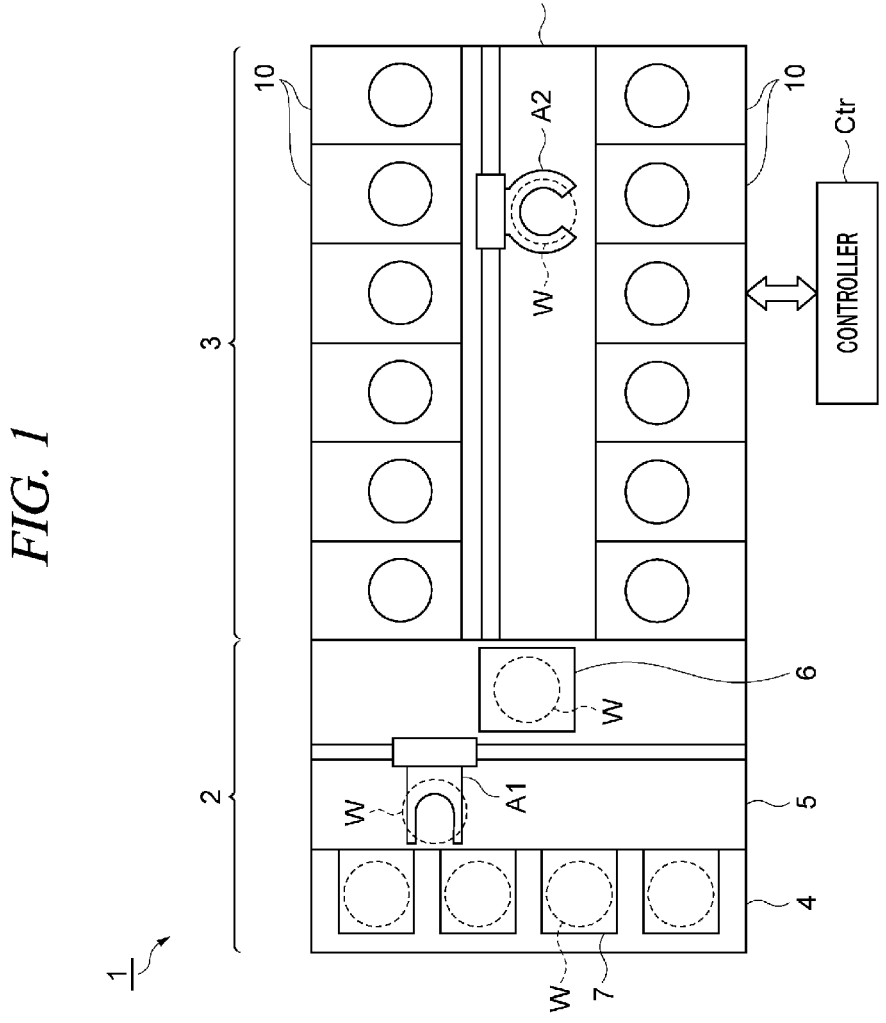
FIG. 1 is a plan view schematically illustrating an example of a substrate processing system.

In the following description, same parts or parts having same functions will be assigned same reference numerals, and redundant description thereof will be omitted. Further, in the present specification, when referring to the top, bottom, right, and left of the drawings, the directions of the symbols in the drawings shall be used as a reference.

[Substrate Processing System]

First, referring to FIG. 1, a substrate processing system 1 (substrate processing apparatus) configured to process a substrate W will be explained. The substrate processing system 1 includes a carry-in/out station 2, a processing station 3, and a controller Ctr (control unit). The carry-in/out station 2 and the processing station 3 may be arranged in a row in a horizontal direction, for example.

Figure 2:
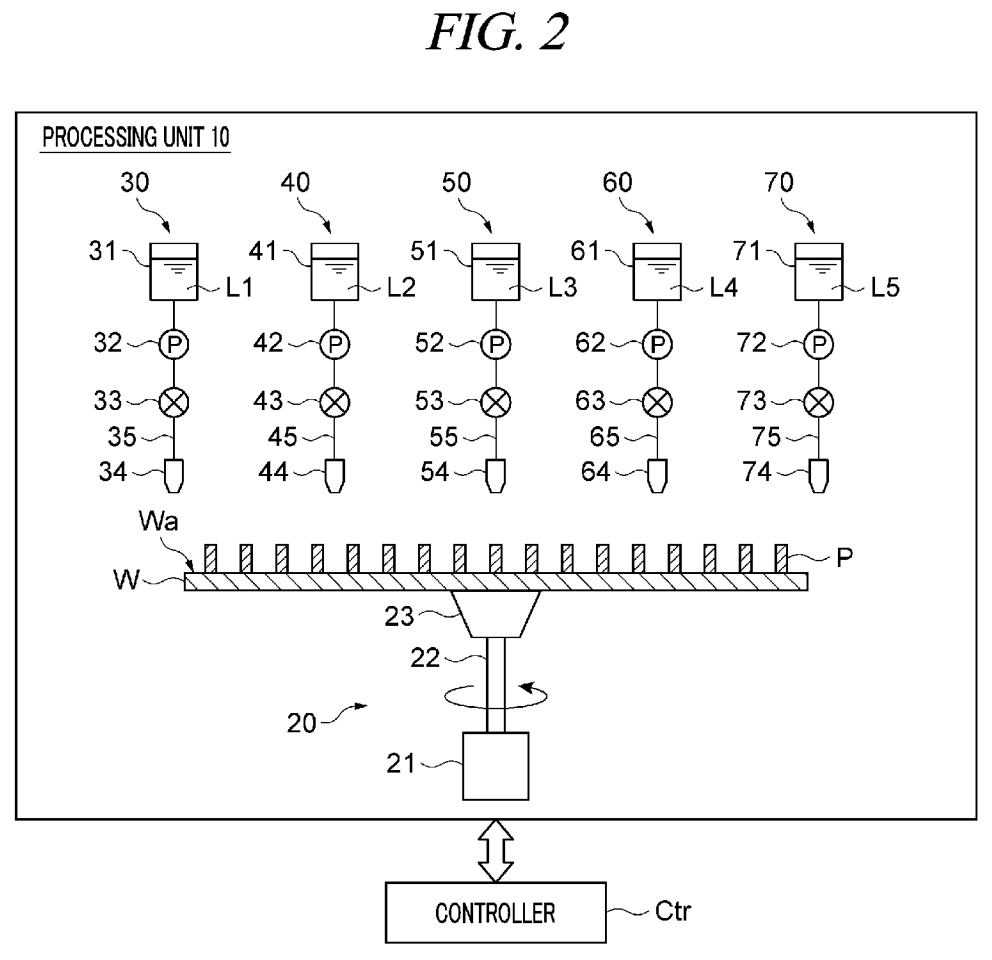

The substrate W may have a circular plate shape, or may have a plate shape other than the circular shape, such as a polygonal shape. The substrate W may have a groove portion where a part of the substrate W is cut out. The groove portion may be, by way of example, a notch (a U-shaped or V-shaped groove, etc.), or may be a straight line-shaped portion (a so-called orientation flat) extending in a straight line shape. The substrate W may be, by way of non-limiting example, a semiconductor substrate (silicon wafer), a glass substrate, a mask substrate, a FPD (Flat Panel Display) substrate, or any of various other types of substrates. The substrate W may have a diameter ranging from, e.g., about 200 mm to about 450 mm. As shown in FIG. 2 to be described later, a predetermined pattern P may be formed on a front surface Wa of the substrate W.

The carry-in/out station 2 includes a placing section 4, a carry-in/out section 5, and a shelf unit 6. The placing section 4 includes a plurality of placing tables (not shown) arranged in a width direction (up-and-down direction of FIG. 1) thereof. Each placing table is configured to place a carrier 7 (receptacle) thereon. The carrier 7 is configured to accommodate therein at least one substrate W in a sealed state. The carrier 7 includes an opening/closing door (not shown) through which the substrate W is carried in and out.

The carry-in/out section 5 is disposed adjacent to the placing section 4 in a direction (left-and-right direction of FIG. 1) in which the carry-in/out station 2 and the processing station 3 are arranged. The carry-in/out section 5 includes an opening/closing door (not shown) provided to correspond to the placing section 4. With the carrier 7 placed on the placing section 4, both the opening and closing door of the carrier 7 and the opening and closing door of the carry-in/out section 5 are opened, allowing the inside of the carry-in/out section 5 and the inside of the carrier 7 to communicate with each other.

The carry-in/out section 5 incorporates therein a transfer arm A1 and the shelf unit 6. The transfer arm A1 is configured to be movable horizontally in the width direction (up-and-down direction of FIG. 1) of the carry-in/out section 5, movable up and down in a vertical direction, and pivotable around a vertical axis. The transfer arm A1 is configured to take out the substrate W from the carrier 7 to hand it over to the shelf unit 6, and, also, configured to receive the substrate W from the shelf unit 6 to return it back into the carrier 7. The shelf unit 6 is located near the processing station 3, and is configured to relay the substrate W between the carry-in/out section 5 and the processing station 3.

The processing station 3 includes a transfer section 8 and a plurality of liquid processing units 10. The transfer section 8 extends horizontally in the direction (left-and-right direction of FIG. 1) in which the carry-in/out station 2 and the processing station 3 are arranged, for example. The transfer section 8 incorporates a transfer arm A2 therein. The transfer arm A2 is configured to be movable in a lengthwise direction (left-right direction of FIG. 1) of the transfer section 8, movable up and down in the vertical direction, and pivotable around a vertical axis. The transfer arm A2 is configured to take out the substrate W from the shelf unit 6 to hand it over to each processing unit 10, and, also, configured to receive the substrate W from each processing unit 10 to return it back into the shelf unit 6.

The plurality of processing units 10 are arranged on both sides of the transfer section 8 in a row along the lengthwise direction (left-right direction of FIG. 1) of the transfer section 8. Each processing unit 10 is configured to perform a preset processing (for example, a cleaning processing) on the substrate W. Details of the processing unit 10 will be described later.

The controller Ctr is configured to control the substrate processing system 1 partially or in overall. Details of controller Ctr will be described later.

[Processing Unit]

Now, referring to FIG. 2, the processing unit 10 will be elaborated. The processing unit 10 includes a rotating/holding unit 20, a cleaning liquid supply 30, a rinse liquid supply a solvent supply 50 (first solvent supply), a solvent supply 60 (second solvent supply), and a solvent supply 70 (third solvent supply).

The rotating/holding unit 20 includes a rotator 21, a shaft 22, and a holder 23. The rotator 21 is operated based on an operation signal from the controller Ctr, and is configured to rotate the shaft 22. The rotator 21 may be a power source such as, but not limited to, an electric motor.

The holder 23 is provided at a leading end of the shaft 22. The holder 23 is configured to attract and hold an entire rear surface of the substrate W by, for example, attraction. In this case, even if the substrate W is bent or the like, the substrate W is corrected so that it is substantially horizontal along a surface of the holder 23. That is, the rotating/holding unit 20 may be configured to rotate the substrate W around a central axis (rotation axis) perpendicular to the front surface of the substrate W while keeping the substrate W in a substantially horizontal posture. As illustrated in FIG. 2, the rotating/holding unit 20 may rotate the substrate W in a counterclockwise direction when viewed from above.

The cleaning liquid supply 30 is configured to supply a cleaning liquid L1 to the substrate W. The cleaning liquid L1 includes, for example, an acidic chemical liquid for removing a thin film (for example, a natural oxide film such as a silicon oxide film) on the front surface Wa of the substrate W, and an alkaline chemical liquid for removing a foreign substance (for example, a particle, an organic substance, etc.) adhering to the front surface Wa of the substrate W. The acidic chemical liquid includes, for example, a SC-2 solution (a mixture of hydrochloric acid, hydrogen peroxide and pure water), a HF solution (hydrofluoric acid), a DHF solution (dilute hydrofluoric acid), a $HNO_3+HF$ solution (a mixture of nitric acid and hydrofluoric acid), or the like. The alkaline chemical liquid includes, for example, a SC-1 solution (a mixture of ammonia, hydrogen peroxide and pure water), hydrogen peroxide, or the like.

The cleaning liquid supply 30 includes a liquid source 31, a pump 32, a valve 33, a nozzle 34, and a pipeline 35. The liquid source 31 is a source of the cleaning liquid L1. The pump 32 is operated based on an operation signal from the controller Ctr, and is configured to send the cleaning liquid L1 sucked from the liquid source 31 to the nozzle 34 via the pipeline 35 and the valve 33.

The valve 33 is operated based on an operation signal from the controller Ctr, and is configured to be switched between an open state in which it allows a flow of a fluid in the pipeline 35 and a closed state in which it blocks the flow of the fluid in the pipeline 35. The nozzle 34 is disposed above the substrate W with a discharge opening thereof oriented toward the front surface Wa of the substrate W. The nozzle 34 is configured to discharge the cleaning liquid L1 sent from the pump 32 through the discharge opening.

The nozzle 34 may be directly or indirectly connected to a non-illustrated driving source. The driving source is operated based on an operation signal from the controller Ctr, and may be configured to move the nozzle 34 along the horizontal direction or the vertical direction above the substrate W. The pipeline 35 connects the liquid source 31, the pump 32, the valve 33, and the nozzle 34 in sequence from the upstream side.

The rinse liquid supply 40 is configured to supply a rinse liquid L2 to the substrate W. The rinse liquid L2 is a liquid for removing (washing away), for example, the cleaning liquid L1 supplied to the front surface Wa of the substrate W and a film component dissolved in the cleaning liquid L1 from the front surface Wa. The rinse liquid L2 includes, by way of example, pure water (DIW: deionized water), ozone water, carbonated water ($CO_2$ water), ammonia water, or the like.

The rinse liquid supply 40 includes a liquid source 41, a pump 42, a valve 43, a nozzle 44, and a pipeline 45. The liquid source 41 is a source of the rinse liquid L2. The pump 42 is operated based on an operation signal from the controller Ctr, and is configured to supply the rinse liquid L2 sucked from the liquid source 41 to the nozzle 44 via the pipeline 45 and the valve 43.

The valve 43 is operated based on an operation signal from the controller Ctr, and is configured to be switched between an open state where it allows a flow of a fluid in the pipeline 45 and a closed state in which it blocks the flow of the fluid in the pipeline 45. The nozzle 44 is disposed above the substrate W with a discharge opening thereof oriented toward the front surface Wa of the substrate W. The nozzle 44 is configured to discharge the rinse liquid L2 sent from the pump 42 through the discharge opening.

The nozzle 44 may be directly or indirectly connected to a non-illustrated driving source. The driving source is operated based on an operation signal from the controller Ctr, and may be configured to move the nozzle 44 along the horizontal direction or the vertical direction above the substrate W. The pipeline 45 connects the liquid source 41, the pump 42, the valve 43, and the nozzle 44 in sequence from the upstream side.

The solvent supply 50 is configured to supply an organic solvent L3 (first organic solvent) to the substrate W. The organic solvent L3 is a liquid for removing (washing away), for example, the rinse liquid L2 supplied to the front surface Wa of the substrate W from the front surface Wa. The organic solvent L3 includes, by way of example, IPA (isopropyl alcohol) or the like.

The solvent supply 50 includes a liquid source 51, a pump 52, a valve 53, a nozzle 54, and a pipeline 55. The liquid source 51 is a source of the organic solvent L3. The pump 52 is operated based on an operation signal from the controller Ctr, and is configured to send the organic solvent L3 sucked from the liquid source 51 to the nozzle 54 via the pipeline 55 and the valve 53.

The valve 53 is operated based on an operation signal from the controller Ctr, and is configured to be switched between an open state in which it allows a flow of a fluid in the pipeline 55 and a closed state in which it blocks the flow of the fluid in the pipeline 55. The nozzle 54 is disposed above the substrate W with a discharge opening thereof oriented toward the front surface Wa of the substrate W. The nozzle 54 is configured to discharge the organic solvent L3 sent from the pump 52 through the discharge opening.

The nozzle 54 may be directly or indirectly connected to a driving source not shown. The driving source is operated based on an operation signal from the controller Ctr, and may be configured to move the nozzle 54 along the horizontal direction or the vertical direction above the substrate W. The pipeline 55 connects the liquid source 51, the pump 52, the valve 53, and the nozzle 54 in sequence from the upstream side.

The solvent supply 60 is configured to supply an organic solvent L4 (second organic solvent) to the substrate W. The organic solvent L4 is a liquid for removing (washing away), for example, the organic solvent L3 supplied to the front surface Wa of the substrate W from the front surface Wa. Details of the organic solvent L4 will be described later.

The solvent supply 60 includes a liquid source 61, a pump 62, a valve 63, a nozzle 64, and a pipeline 65. The liquid source 61 is a source of the organic solvent L4. The pump 62 is operated based on an operation signal from the controller Ctr, and is configured to send the organic solvent L4 sucked from the liquid source 61 to the nozzle 64 via the pipeline 65 and the valve 63.

The valve 63 is operated based on an operation signal from the controller Ctr, and is configured to be switched between an open state in which it allows a flow of a fluid in the pipeline 65 and a closed state in which it blocks the flow of the fluid in the pipeline 65. The nozzle 64 is disposed above the substrate W with a discharge opening thereof oriented toward the front surface Wa of the substrate W. The nozzle 64 is configured to discharge the organic solvent L4 sent from the pump 62 through the discharge opening.

The nozzle 64 may be directly or indirectly connected to a driving source not shown. The driving source is operated based on an operation signal from the controller Ctr, and may be configured to move the nozzle 64 along the horizontal direction or the vertical direction above the substrate W. The pipeline 65 connects the liquid source 61, the pump 62, the valve 63, and the nozzle 64 in sequence from the upstream side.

The solvent supply 70 is configured to supply an organic solvent L5 (third organic solvent) to the substrate W. The organic solvent L5 is a liquid for removing (washing away), for example, the organic solvent L4 supplied to the front surface Wa of the substrate W from the front surface Wa. Details of the organic solvent L5 will be described later.

The solvent supply 70 includes a liquid source 71, a pump 72, a valve 73, a nozzle 74, and a pipeline 75. The liquid source 71 is a source of the organic solvent L5. The pump 72 is operated based on an operation signal from the controller Ctr, and is configured to send the organic solvent L5 sucked from the liquid source 71 to the nozzle 74 via the pipeline 75 and the valve 73.

The valve 73 is operated based on an operation signal from the controller Ctr, and may be configured to be switched between an open state in which it allows a flow of a fluid in the pipeline 75 and a closed state in which it blocks the flow of the fluid in the pipeline 75. The nozzle 74 is disposed above the substrate W with a discharge opening thereof oriented toward the front surface Wa of the substrate W. The nozzle 74 is configured to discharge the organic solvent L5 sent from the pump 72 through the discharge opening.

The nozzle 74 may be directly or indirectly connected to a driving source not shown. The driving source is operated based on an operation signal from the controller Ctr, and may be configured to move the nozzle 74 along the horizontal direction or the vertical direction above the substrate W. The pipeline 75 connects the liquid source 71, the pump 72, the valve 73, and the nozzle 74 in sequence from the upstream side.

[Liquids for Substrate Processing]

Here, liquids used for a substrate processing in the present specification will be explained in further detail.

The organic solvent L4 is a solvent having water solubility (solubility in water) lower than that of the organic solvent L3 and a boiling point higher than that of the organic solvent L3. The organic solvent L5 has water solubility lower than that of the organic solvent L3 and a boiling point higher than that of the organic solvent L4. The organic solvent L4 (L5) may be, by way of non-limiting example, at least one selected from the group consisting of propylene glycol monomethyl ether (PGME), propylene glycol monomethyl ether acetate (PGMEA), esters mainly composed of butyl acetate (nBA) or ethyl lactate, cyclohexanone, Higher alcohols (e.g., 1-pentanol), a freon-based solvent (e.g., 'NOVEC (registered trademark) 7300' manufactured by 3M), a chlorine-based solvent, a long-chain alkane (e.g., octane), and an aromatic hydrocarbon (e.g., toluene).

The organic solvent L4 (L5) may be a mixed solution in which a plurality of organic solvents are mixed. The organic solvent L4 (L5) may be a mixed solution in which two or more solvents selected from the above-specified group are mixed. In this case, a parameter such as a boiling point can be easily adjusted by, for example, mixing the plurality of organic solvents having different water solubility. The organic solvent L4 (L5) may be, for example, a mixed solution in which 10 wt % to 90 wt % of PGME and 90 wt % to wt % of PGMEA are mixed, or a mixed solution in which 10 wt % to 90 wt % of PGME and wt % to 10 wt % of butyl acetate are mixed. The organic solvent L4 (L5) may be, for example, a mixed solution (OK73 thinner: produced by Tokyo Ohka Kogyo Co., Ltd.) in which 70 wt % of PGME and 30 wt % of PGMEA are mixed.

The solubility parameter (hereinafter, also referred to as "SP value") of the organic solvent L3 may be smaller than the SP value of the rinse liquid L2. The SP value of the organic solvent L4 may be smaller than the SP value of the organic solvent L3. The SP value of the organic solvent L5 may be smaller than the SP value of the organic solvent L4.

The SP value is a parameter representing an affinity measure between substances, and it is empirically known that the smaller the difference between the SP values of two components, the higher the solubility may be. As an example method of estimating the SP value, the Hansen method [C. M. Hansen: J. Paint Tech., 39[505], 104-117(1967), the Hoy method [H. L. Hoy: J. Paint Tech., 42[540], 76-118(1970)], the Fedors method [R. F. Fedors: Polym. Eng. Sci., 14 [2], 147-154 (1974)], and the like are known.

Table 1 presents data of boiling points, water solubility and SP values of some of the liquids exemplified in this specification (source: Kobayashi Toshigatsu, and 20 others, 'Solubility Parameter Application Case Study', Information Organization, Inc., 2007 March of the year). In addition, the SP values of Table 1 are calculated according to the Fedors method.

TABLE 1

| Solvent | Boiling point [° C.] | Water solubility [g/100 ml] | SP value [(cal/cm$^3$)$^{1/2}$] |
|---|---|---|---|
| DIW | 100 | — | 23.4 |
| IPA | 82 | ∞ | 11.6 |
| PGME | 120 | ∞ | 11.2 |
| PGMEA | 146 | 18.6 | 8.7 |
| Cyclohexanone | 155 | 10 or less | 10.5 |
| 1-pentanol | 138 | 22 | 11.0 |
| Ethyl lactate | 154 | ∞ | 9.3 |
| Butyl acetate | 126 | 0.7 | 9.1 |
| NOVEC (registered trademark) 7300 | 98 | 0.1 or less | 12.5 |
| Octane | 126 | 0.1 or less | 9.1 |
| Toluene | 111 | 0.1 or less | 7.6 |

[Details of Controller]

Figure 3:
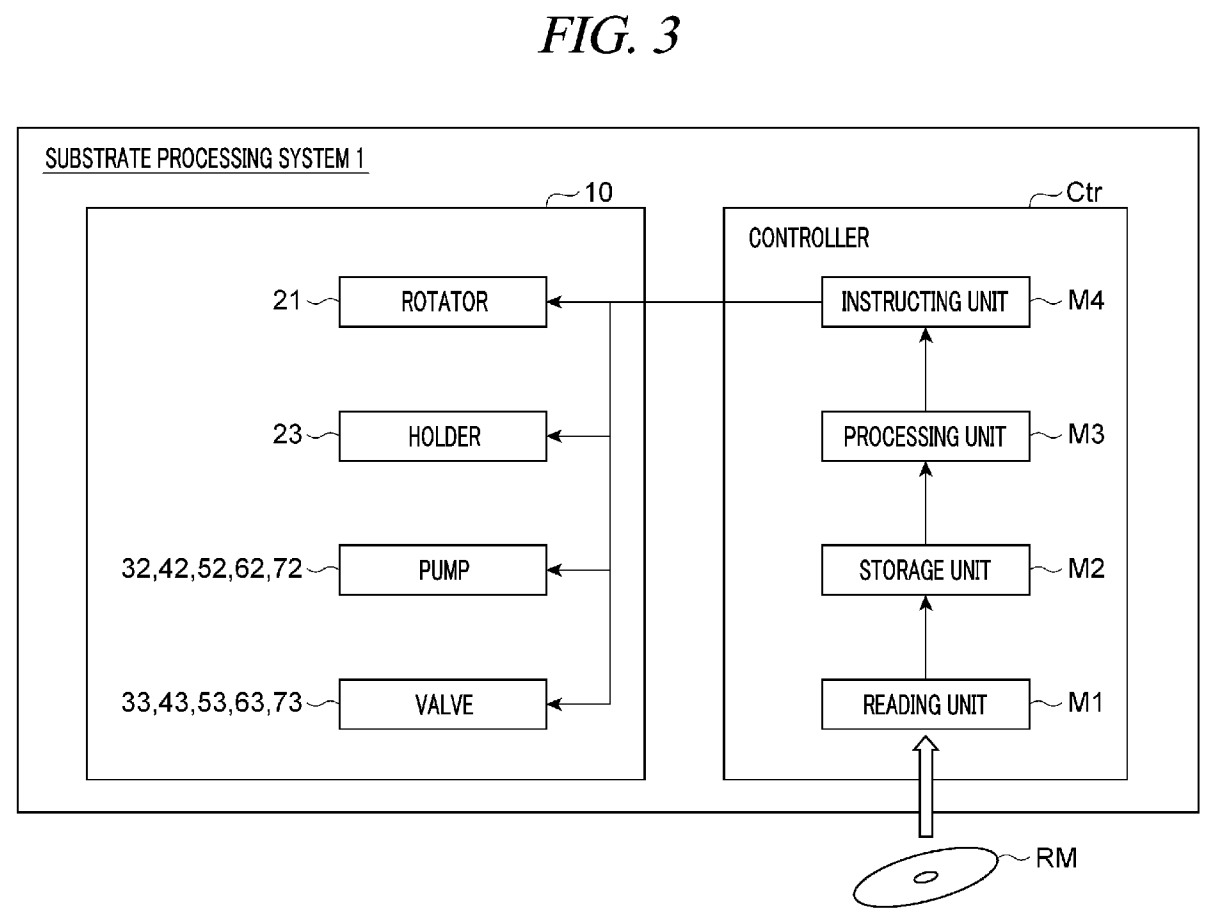

As depicted in FIG. 3, the controller Ctr has, as functional modules, a reading unit M1, a storage unit M2, a processing unit M3, and an instructing unit M4. These functional modules are nothing more than divisions of functions of the controller Ctr for convenience's sake, and it does not necessarily mean that the hardware constituting the controller Ctr is divided into these modules. Each functional module is not limited to being implemented by execution of a program but may be implemented by a dedicated electric circuit (for example, a logic circuit) or an ASIC (Application Specific Integrated Circuit) as an integration of these electric circuits.

The reading unit M1 is configured to read a program from a computer-readable recording medium RM. The recording medium RM stores thereon a program for operating the individual components of the substrate processing system 1 including the processing unit 10. The recording medium RM may be, for example, a semiconductor memory, an optical recording disc, a magnetic recording disc, a magneto-optical recording disc, or the like. The individual components of the substrate processing system 1 may include the rotator 21, the holder 23, the pumps 32, 42, 52, 62, and 72, and the valves 33, 43, 53, 63, and 73.

The storage unit M2 is configured to store therein various types of data. The storage unit M2 may store therein, by way of example, the program read from the recording medium RM by the reading unit M1, setting data inputted from an operator through an external input device (not shown), and so forth. The storage unit M2 may store therein, for example, processing conditions for processing the substrate W.

The processing unit M3 is configured to process various types of data. For example, the processing unit M3 may generate, based on the various types of data stored in the storage unit M2, signals for operating the individual components of the substrate processing system 1.

The instructing unit M4 is configured to send the operation signals generated by the processing unit M3 to the individual components of the substrate processing system 1.

Figure 4:
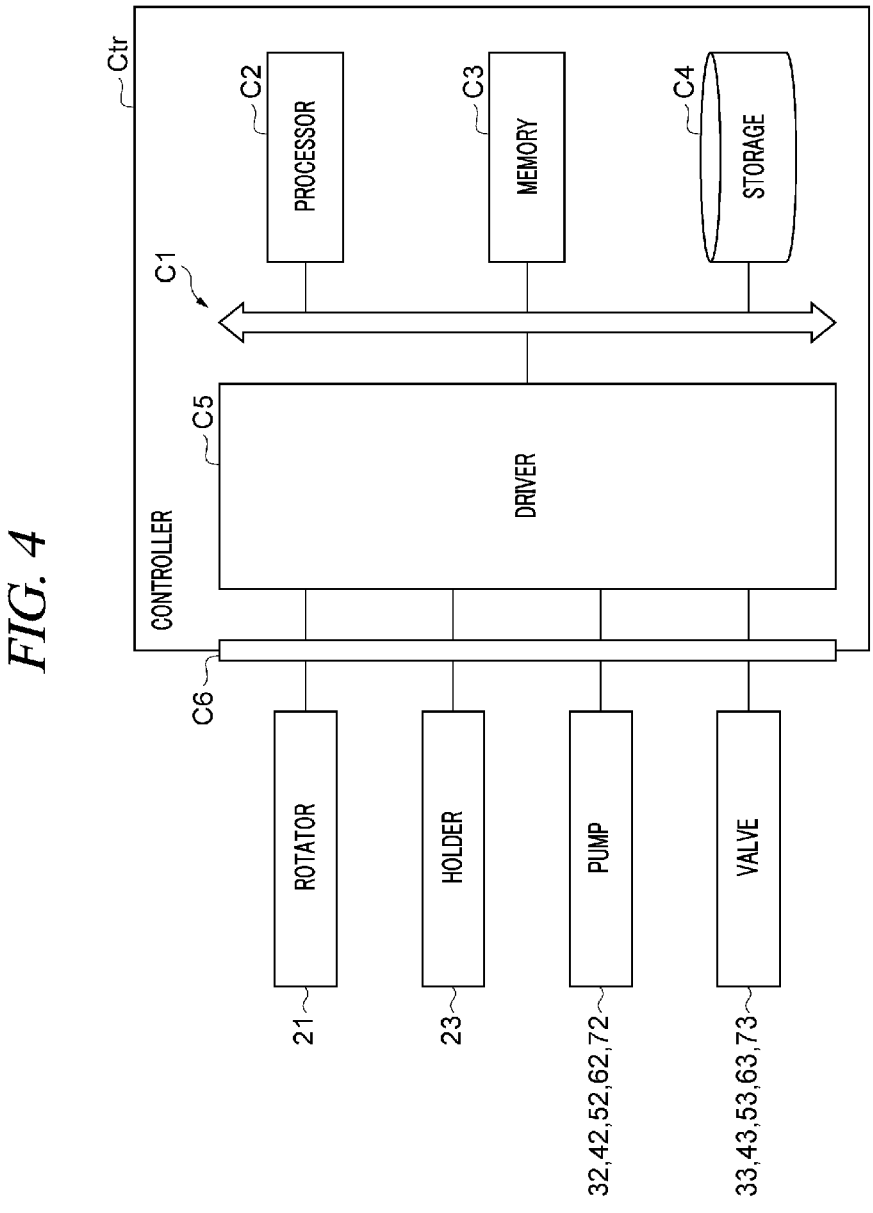
FIG. 4 is a schematic diagram illustrating an example of a hardware configuration of a controller.
Figure 5:
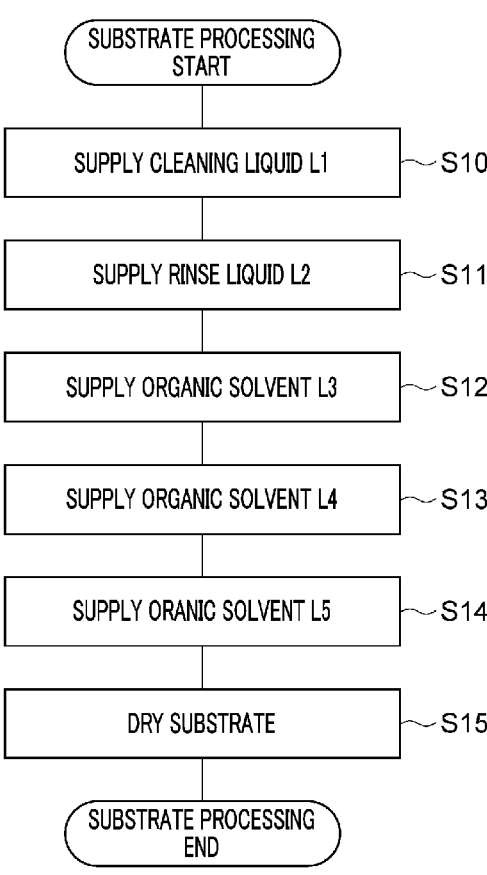
FIG. 5 is a flowchart for describing an example of a processing sequence of a substrate.
Figure 6A:
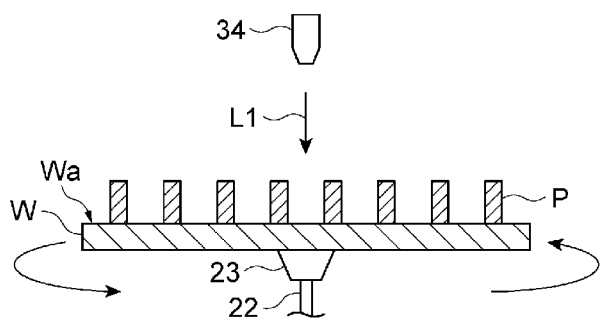
FIG. 6A to FIG. 6C are diagrams for describing an example of the processing sequence of the substrate.
Figure 6B:
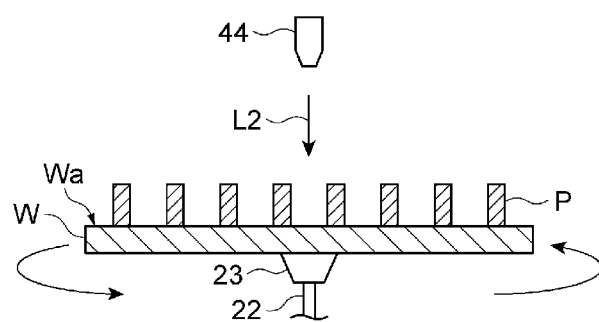
Figure 6C:
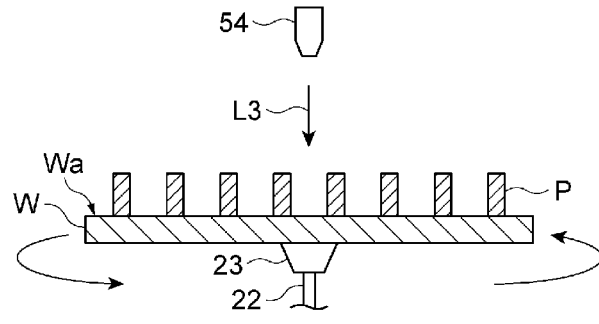
Figure 7A:
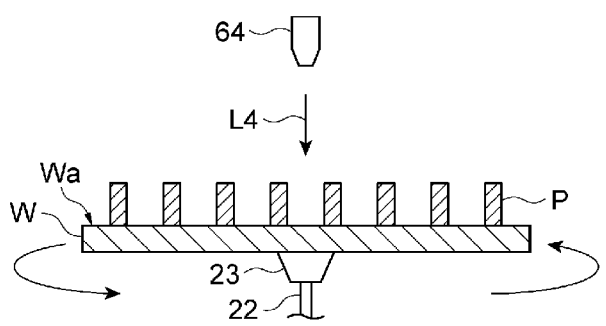
FIG. 7A to FIG. 7C are diagrams for describing the processing sequence following that of FIG. 6A to FIG. 6C.
Figure 7B:
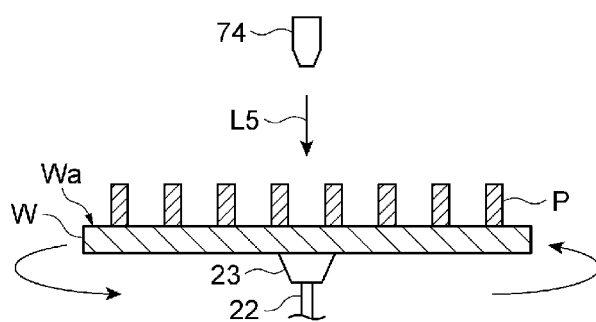
Figure 7C:
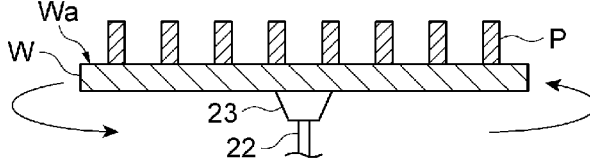

The hardware of the controller Ctr may be composed of, by way of example, one or more control computers. The controller Ctr may include, as a hardware component, a circuit C1, as shown in FIG. 4. The circuit C1 may be composed of electric circuit elements (circuitry). The circuit C1 may include, by way of example, a processor C2, a memory C3, a storage C4, a driver C5, and an input/output port C6.

The processor C2 may be configured to implement the aforementioned individual functional modules by executing the program in cooperation with at least one of the memory C3 and the storage C4 and performing an input/output of signals via the input/output port C6. The memory C3 and the storage C4 may serve as the storage unit M2. The driver C5 may be a circuit configured to drive the respective components of the substrate processing system 1 individually. The input/output port C6 may be configured to enable an input/output of signals between the driver C5 and the individual components of the substrate processing system 1.

The substrate processing system 1 may be equipped with one controller Ctr or a controller group (control unit) composed of a plurality of controllers Ctr. When the substrate processing system 1 is equipped with the controller group, each of the aforementioned functional modules may be implemented by a single controller Ctr or a combination of two or more controllers Ctr. If the controller Ctr is composed of a plurality of computers (circuits C1), each of the aforementioned functional modules may be implemented by a single computer (circuit C1) or a combination of two or more computers (circuits C1). The controller Ctr may include a plurality of processors C2. In this case, each of the aforementioned functional modules may be implemented by a single processor C2 or a combination of two or more processors C2.

[Substrate Processing Method]

Now, referring to FIG. 5 to FIG. 7C, a processing method for the substrate W will be described. Prior to the start of this method, the carrier 7 is previously placed on the placing table of the placing section 4. The carrier 7 accommodates therein at least one substrate W having the pattern P formed on the front surface Wa thereof.

First, the controller Ctr controls the transfer arms A1 and A2 to take out a single sheet of substrate W from the carrier 7 and transfer it into one of the processing units 10. The substrate W transferred into the processing unit 10 is placed on the holder 23.

Then, the controller Ctr controls the rotator 21 and the holder 23 (rotating/holding unit 20) to attract and hold the rear surface of the substrate W with the holder 23 and, also, to rotate the substrate W. In this state, the controller Ctr controls the pump 32 and the valve 33 (cleaning liquid supply 30) to supply the cleaning liquid L1 from the nozzle 34 to near the center of the front surface Wa of the substrate W (see process S10 of FIG. 5 and FIG. 6A). By the rotation of the substrate, the cleaning liquid L1 supplied to the front surface Wa of the substrate W is made to flow on the entire front surface Wa from the central portion of the substrate W toward the edge thereof, and is then scattered outwards from the edge of the substrate W. For this reason, while the supply of the cleaning liquid L1 from the nozzle 34 is being carried on, the liquid film of the cleaning liquid L1 is formed on the front surface Wa of the substrate W. At this time, the substrate W is cleaned by the cleaning liquid L1.

In the process S10, the cleaning liquid L1 may be supplied to the substrate W under the processing condition 1 as follows, for example.

<Processing Condition 1>
    Rotation speed of substrate W: about 1000 rpm
    Rotational acceleration of substrate W: about 500 rpm/s
    Supply time of cleaning liquid L1: about 30 seconds
    Discharge flow rate of cleaning liquid L1: about 1000 ml/min Next, the controller Ctr controls the rotator 21 and the holder 23 (rotating/holding unit 20) to attract and hold the rear surface of the substrate W with the holder 23 and, also, to rotate the substrate W. In this state, the controller Ctr controls the pump 42 and the valve 43 (rinse liquid supply 40) to supply the rinse liquid L2 from the nozzle 44 to near the center of the front surface Wa of the substrate W (see process S11 of FIG. 5 and FIG. 6B). By the rotation of the substrate W, the rinse liquid L2 supplied to the front surface Wa of the substrate W is made to flow on the entire front surface Wa from the central portion of the substrate W toward the edge thereof while being replaced with the cleaning liquid L1, and is then scattered outwards from the edge of the substrate W. For this reason, the cleaning liquid L1 is removed from the front surface Wa of the substrate W and, also, while the supply of the rinse liquid L2 from the nozzle 44 is being carried on, the liquid film of the rinse liquid L2 is formed on the front surface Wa of the substrate W.

In the process S11, the rinse liquid L2 may be supplied to the substrate W under the processing condition 2 as follows, for example.

<Processing Condition 2>
    Rotation speed of substrate W: about 1000 rpm
    Rotational acceleration of substrate W: about 500 rpm/s
    Supply time of rinse liquid L2: about 30 seconds
    Discharge flow rate of rinse liquid L2: about 1000 ml/min Thereafter, the controller Ctr controls the rotator 21 and the holder 23 (rotating/holding unit 20) to attract and hold the rear surface of the substrate W with the holder 23 and, also, to rotate the substrate W. In this state, the controller Ctr controls the pump 52 and the valve 53 (solvent supply 50) to supply the organic solvent L3 from the nozzle 54 to near the center of the front surface Wa of the substrate W (see process S12 of FIG. 5 and FIG. 6C). By the rotation of the substrate W, the organic solvent L3 supplied to the front surface Wa of the substrate W is made to flow on the entire front surface Wa while being replaced with the rinse liquid L2 from the central portion of the substrate W toward the edge thereof, and is then scattered outwards from the edge of the substrate W. For this reason, the rinse liquid L2 is removed from the front surface Wa of the substrate W, and while the supply of the organic solvent L3 from the nozzle 54 is being carried on, the liquid film of the organic solvent L3 is formed on the front surface Wa of the substrate W.

In the process S12, the organic solvent L3 may be supplied to the substrate W under the processing condition 3 as follows, for example.

<Processing Condition 3>
    Rotation speed of substrate W: about 1000 rpm
    Rotational acceleration of substrate W: about 500 rpm/s
    Supply time of organic solvent L3: about 30 seconds
    Discharge flow rate of organic solvent L3: about 100 ml/min Next, the controller Ctr controls the rotator 21 and the holder 23 (rotating/holding unit 20) to attract and hold the rear surface of the substrate W with the holder 23 and, also, to rotate the substrate W. In this state, the controller Ctr controls the pump 62 and the valve 63 (solvent supply 60) to supply the organic solvent L4 from the nozzle 64 to near the center of the front surface Wa of the substrate W (see process S13 of FIG. 5 and FIG. 7A). By the rotation of the substrate W, the organic solvent L4 supplied to the front surface Wa of the substrate W is made to flow on the entire front surface Wa while being replaced with the organic solvent L3 from the central portion of the substrate W toward the edge thereof, and is then scattered outwards from the edge of the substrate W. For this reason, the organic solvent L3 is removed from the front surface Wa of the substrate W, and while the supply of the organic solvent L4 from the nozzle 64 is being carried on, the liquid film of the organic solvent L4 is formed on the front surface Wa of the substrate W.

In the process S13, the organic solvent L4 may be supplied to the substrate W under the processing condition 4 as follows, for example.

<Processing Condition 4>
    Rotation speed of substrate W: about 1000 rpm
    Rotational acceleration of substrate W: about 500 rpm/s
    Supply time of organic solvent L4: about 10 seconds
    Discharge flow rate of organic solvent L4: about 100 ml/min Subsequently, the controller Ctr controls the rotator 21 and the holder 23 (rotating/holding unit 20) to attract and hold the rear surface of the substrate W with the holder 23 and, also, to rotate the substrate W. In this state, the controller Ctr controls the pump 72 and the valve 73 (solvent supply 70) to supply the organic solvent L5 from the nozzle 74 to near the center of the front surface Wa of the substrate W (see process S14 of FIG. 5 and FIG. 7B). By the rotation of the substrate W, the organic solvent L5 supplied to the front surface Wa of the substrate W is made to flow on the entire front surface Wa while being replaced with the organic solvent L4 from the central portion of the substrate W toward the edge thereof, and is then scattered outwards from the edge of the substrate W. For this reason, the organic solvent L4 is removed from the front surface Wa of the substrate W, and, while the supply of the organic solvent L5 from the nozzle 74 is being carried on, the liquid film of the organic solvent L5 is formed on the front surface Wa of the substrate W.

In the process S14, the organic solvent L5 may be supplied to the substrate W under the processing condition 5 as follows, for example.

<Processing Condition 5>
    Rotation speed of substrate W: about 1000 rpm
    Rotational acceleration of substrate W: about 500 rpm/s
    Supply time of organic solvent L5: about 10 seconds
    Discharge flow rate of organic solvent L5: about 100 ml/min Next, the controller Ctr controls the rotator 21 and the holder 23 (rotating/holding unit 20) to attract and hold the rear surface of the substrate W with the holder 23 and, also, to rotate the substrate W. As a result, the organic solvent L5 on the front surface Wa of the substrate W is scattered outwards from the edge of the substrate W, so that the substrate W is dried (see process S15 of FIG. 5 and FIG. 7C). As a result of the above, the processing of the substrate W is completed.

In the process S15, the substrate W may be dried under the processing condition 6 as follows, for example.

<Processing Condition 6>

Rotation speed of substrate W: about 1500 rpm

Rotational acceleration of substrate W: about 500 rpm/s

Drying time of substrate W: about 30 seconds

[Effects]

According to the above-described exemplary embodiment, the organic solvent L3, the organic solvent L4, and the organic solvent L5 are supplied to the substrate W in this order. Since the organic solvents L4 and L5 have lower water solubility than the organic solvent L3, they relatively do not include moisture in the air. Thus, if the drying of the substrate W is performed after replacing the organic solvent L3 with the organic solvent L4 and then replacing the organic solvent L4 with the organic solvent L5, it becomes very difficult for the moisture to remain on the substrate W. Further, since the boiling point of the organic solvent L4 is higher than that of the organic solvent L3, it is relatively difficult for the organic solvent L4 to vaporize. In addition, since the boiling point of the organic solvent L5 is higher than that of the organic solvent L4, it is more difficult for the organic solvent L5 to vaporize. For this reason, a decrease in the temperature of the substrate W is extremely difficult to occur. Therefore, condensation and absorption of moisture in the atmosphere are suppressed without needing to provide a heating source and a moisture absorbing device. As a result, it becomes possible to suppress formation of water marks while suppressing the cost of the substrate processing.

According to the above-described exemplary embodiment, the SP values can be set to get smaller in the order of the rinse liquid L2, the organic solvent L3, the organic solvent L4, and the organic solvent L5. In this case, the organic solvent L3 is easily soluble in the rinse liquid L2, the organic solvent L4 is easily soluble in the organic solvent L3, and the organic solvent L5 is easily soluble in the organic solvent L4. Therefore, when the organic solvent L3 is supplied to the substrate W, the rinse liquid L2 is removed from the substrate W by being mixed with the organic solvent L3, so that it becomes difficult for the rinse liquid L2 to remain on the substrate W. Likewise, when the organic solvent L4 is supplied to the substrate W, the organic solvent L3 is removed from the substrate W by being mixed with the organic solvent L4, so that it becomes difficult for the organic solvent L3 to remain on the substrate W. Likewise, when the organic solvent L5 is supplied to the substrate W, the organic solvent L4 is removed from the substrate W by being mixed with the organic solvent L5, so that it becomes difficult for the organic solvent L4 to remain on the substrate W. As a result, since the rinse liquid L2, the organic solvent L3, and the organic solvent L4 are sequentially replaced by the subsequent liquids, the formation of water marks can be further suppressed especially when DIW (pure water) is used as the rinse liquid.

Modification Examples

The exemplary embodiments disclosed herein are illustrative in all aspects and do not limit the present disclosure. The above-described exemplary embodiments may be omitted, substituted, or changed in various forms without departing from the scope and spirit of the appended claims.

(1) In the process S13, the organic solvent L4 may be supplied to the substrate W while repeating the acceleration and deceleration of the rotation of the substrate W. For example, in the process S13, after supplying the organic solvent L4 to the substrate W under the processing condition 4 described above, the supply of the organic solvent L4 may be continued under the processing condition 4A to be specified below. That is, under the processing condition 4A, the rotation of the substrate W may be accelerated or decelerated while the rotation speed of the substrate W is varied between about 100 rpm and about 1000 rpm.

<Processing Condition 4A>

Rotation speed of substrate W: about 100 rpm to about 1000 rpm

Rotational acceleration of substrate W: about 500 rpm/s

Supply time of organic solvent L4: about 30 seconds

Discharge flow rate of organic solvent L4: about 100 ml/min

Likewise, in the process S14, the organic solvent L5 may be supplied to the substrate W while repeating the acceleration and deceleration of the rotation of the substrate W. For example, in the process S14, after the organic solvent L5 is supplied to the substrate W under the processing condition 5 described above, the supply of the organic solvent L5 may be continued under the processing condition 5A to be described below. That is, under the processing condition 5A, the rotation of the substrate W may be accelerated or decelerated while the rotation speed of the substrate W is varied between about 100 rpm and about 2000 rpm.

<Processing Condition 5A>

Rotation speed of substrate W: about 100 rpm to about 2000 rpm

Rotational acceleration of substrate W: about 500 rpm/s

Supply time of organic solvent L4: about 30 seconds

Discharge flow rate of organic solvent L4: about 100 ml/min

Figure 8A:
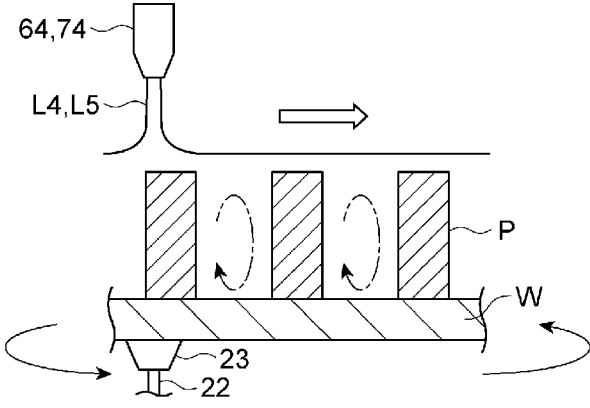
FIG. 8A to FIG. 8C are diagrams for describing an example of a flow state of an organic solvent on the substrate.
Figure 8B:
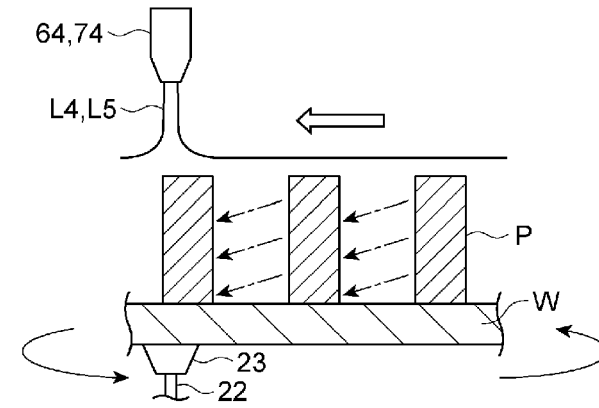
Figure 8C:
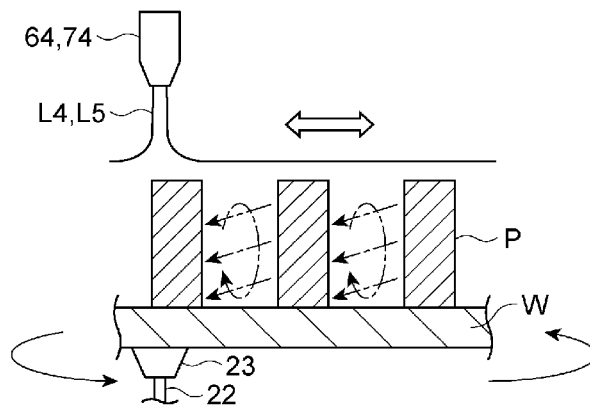

In the above-described cases, when the rotation of the substrate W is accelerated, the liquid on the substrate W is directed toward the edge of the substrate W in a diametrical direction of the substrate W (see FIG. 8A). Accordingly, when the substrate W has the patterns P formed thereon, a rotational flow, which flows from top to bottom and then flows toward a rotation center of the substrate W, is generated in a gap between the patterns P (see FIG. 8A). Further, when the rotation of the substrate W is decelerated, the liquid on the substrate W is directed toward the rotation center of the substrate W in the diametrical direction of the substrate W (see FIG. 8B). Accordingly, when there are the patterns P on the substrate W, a flow directed obliquely downwards toward the rotation center of the substrate W is generated in the gap between the patterns P (see FIG. 8B). Therefore, when the acceleration and the deceleration of the rotation of the substrate W is repeated, the liquid on the substrate W is shaken in the diametrical direction of the substrate W. Accordingly, in the process S13, the organic solvent L3 is easily replaced by the organic solvent L4, and in the process S14, the organic solvent L4 is easily replaced by the organic solvent L5. In particular, when there are the patterns P on the substrate W, as depicted in FIG. 8C, the organic solvent that has entered the gap between the patterns P is mixed with the organic solvent supplied in the subsequent process, thus allowing the organic solvent supplied in the previous process to be easily removed from the gap. Therefore, it becomes possible to effectively remove the organic solvent supplied in the previous process from the substrate W.

As can be seen from the processing conditions 4A and 5A, the maximum rotation speed (for example, about 2000 rpm) of the substrate W in the process S14 may be larger than the maximum rotation speed (for example, about 1000 rpm) of the substrate W in the process S13. In this case, since a larger centrifugal force is applied to the organic solvent L5, the replacement of the organic solvent L4 with the organic solvent L5 can be accelerated.

Figure 9A:
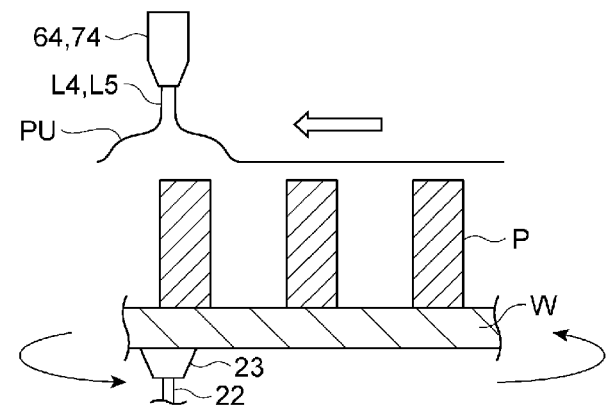
FIG. 9A and FIG. 9B are diagrams for describing another example of the flow state of the organic solvent on the substrate.
Figure 9B:
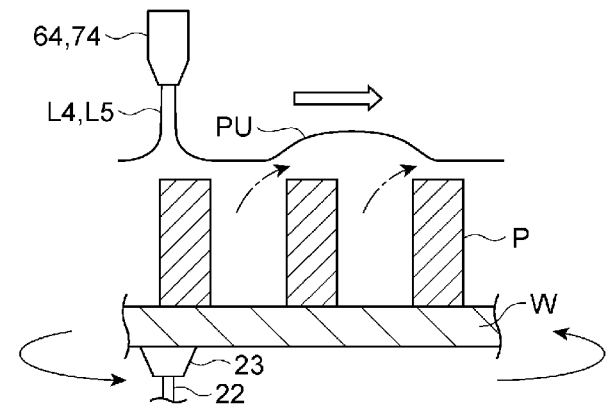

(2) As stated above, in case of repeating the acceleration and the deceleration of the rotation of the substrate W in the processes S13 and S14, the supply amount of the organic solvents L4 and L5 to the substrate W may be temporarily increased when the substrate W is rotated at a low speed (for example, about 100 rpm to about 300 rpm). In this case, when the substrate W is rotated at the low speed, a liquid puddle PU of the organic solvents L4 and L5 is formed on the front surface Wa of the substrate W (see FIG. 9A). Accordingly, if the rotation speed of the substrate W is accelerated thereafter, the liquid puddle PU having a relatively large mass is moved toward the edge of the substrate W in a lumpy state (see FIG. 9B). At this time, the liquid on the substrate W is also moved to the edge of the substrate W by being drawn by the liquid puddle PU in the form of the lump. In particular, when there are the patterns P on the substrate W, the liquid (the organic solvent supplied in the previous process) that has entered the gap between the patterns P is drawn out of the gap by the movement of the liquid puddle PU in the form of the lump. Therefore, it becomes possible to effectively remove the organic solvent supplied in the previous process from the substrate W.

(3) In the above-described exemplary embodiment, the organic solvent L5 is supplied to the substrate W after the supply of the organic solvent L4. However, the supply of the organic solvent L5 may not be performed. That is, the process S14 of FIG. 5 may be omitted. Alternatively, another organic solvent may be supplied to the substrate W after the supply of the organic solvent L5.

In case that a plurality of organic solvents are supplied after supplying the organic solvent L3, the plurality of organic solvents may be referred to as a second organic solvent, a third organic solvent, . . . , an $N^{th}$ organic solvent (N is a natural number equal to or larger than 2). In this case, an $n^{th}$ organic solvent (n is any natural number ranging from 3 to N) may have the water solubility lower than that of the first organic solvent and the boiling point higher than that of a $(n-1)^{th}$ organic solvent. Further, the SP value of the $n^{th}$ organic solvent may be set to be smaller than the SP value of the $(n-1)^{th}$ organic solvent.

(4) In the above-described exemplary embodiment, although the various kinds of liquids are supplied to the front surface Wa of the substrate W, they may be supplied to the rear surface of the substrate W. In this case as well, it is possible to suppress the formation of water marks while suppressing the cost of substrate processing.

(5) The technique of the present disclosure may be applied to the substrate W on which no pattern P is formed. In this case as well, it is possible to suppress the formation of water marks while suppressing the cost of substrate processing.

Other Examples

Example 1. An example of a substrate processing method may include forming, by supplying a cleaning liquid to a substrate while rotating the substrate, a liquid film of the cleaning liquid on the substrate; forming, by supplying a rinse liquid to the substrate while rotating the substrate, a liquid film of the rinse liquid on the substrate and removing the cleaning liquid from the substrate, after the forming of the liquid film of the cleaning liquid; forming, by supplying a first organic solvent to the substrate while rotating the substrate, a liquid film of the first organic solvent on the substrate and removing the rinse liquid from the substrate, after the forming of the liquid film of the rinse liquid;

forming, by supplying a second organic solvent to the substrate while rotating the substrate, a liquid film of the second organic solvent on the substrate and removing the first organic solvent from the substrate, after the forming of the liquid film of the first organic solvent; and drying the substrate after the forming of the liquid film of the second organic solvent. The second organic solvent may have water solubility lower than that of the first organic solvent and a boiling point higher than that of the first organic solvent.

Meanwhile, if the substrate is dried after supplying the rinse liquid to the substrate, there is a risk that the pattern formed on the substrate may be damaged or collapsed due to the surface tension of the rinse liquid. In addition, this risk is conspicuous especially when the surface of the substrate is hydrophobic. That is, a centrifugal force acting on the liquid increases near the edge of the substrate, so that a state in which the liquid film is broken is likely to appear. In this case, there is a risk that a water mark may be formed in a region of the substrate where the liquid film is broken and minute particles may adhere thereto. To solve the problem, there is known a method of drying the substrate after supplying a volatile organic solvent (for example, IPA (isopropyl alcohol), etc.) to the substrate after the rinse liquid to replace the rinse liquid with this organic solvent.

In this case, however, there is a risk that the substrate is cooled by heat of the vaporization of the organic solvent, moisture in the atmosphere condenses on the substrate, and water marks may be formed on the substrate. Further, when the IPA is used in particular, since the hygroscopic property of the IPA is high, the risk of water mark formation on the substrate increases. As a resolution, there is known a method of processing the substrate while heating the substrate (see Patent Document 1) or a method of setting a processing environment for the substrate into a dry atmosphere. In these cases, a heating source and a moisture absorbing device are additionally required, which may result in an increase of the cost and the running cost of the apparatus.

Meanwhile, in the case of Example 1, the second organic solvent is supplied after the first organic solvent is supplied. Since the second organic solvent has lower water solubility than that of the first organic solvent, it is relatively difficult for the second organic solvent to include the moisture in the air. For this reason, if the substrate is dried after replacing the first organic solvent with the second organic solvent, it becomes difficult for moisture to remain on the substrate. In addition, since the boiling point of the second organic solvent is higher than that of the first organic solvent, it is relatively difficult for the second organic solvent to vaporize. For this reason, the temperature decrease of the substrate is unlikely to occur. Therefore, the condensation and the absorption of the moisture in the atmosphere are suppressed without needing to add the heating source and the moisture absorbing device. As a result, it is possible to suppress the formation of the water marks while suppressing the cost of the substrate processing.

Example 2. In the method of Example 1, a solubility parameter (SP value) of the first organic solvent may be smaller than a solubility parameter (SP value) of the rinse liquid, and a solubility parameter (SP value) of the second organic solvent may be smaller than the solubility parameter (SP value) of the first organic solvent. It is known that solutions having more similar solubility parameters (SP values) have a stronger tendency to dissolve each other. For this reason, according to Example 2, the first organic solvent is easily dissolved in the rinse liquid, and the second organic solvent is easily dissolved in the first organic solvent. Therefore, when the first organic solvent is supplied to the substrate, the rinse liquid is mixed with the first organic solvent and is removed from the substrate, making it difficult for the rinse liquid to remain on the substrate. Likewise, when the second organic solvent is supplied to the substrate, the first organic solvent is mixed with the second organic solvent and is removed from the substrate, making it difficult for the first organic solvent to remain on the substrate. As a result, especially when pure water is used as the rinse liquid, the formation of the water marks can be further suppressed.

Example 3. In the method of Example 1 or 2, the second organic solvent may be a mixed solution in which multiple kinds of organic solvents are mixed. In this case, a parameter such as a boiling point can be easily adjusted by mixing the multiple organic solvents having different water solubility, for example.

Example 4. In the method of any one of Examples 1 to 3, the forming of the liquid film of the second organic solvent may include supplying the second organic solvent to the substrate while repeating acceleration and deceleration of a rotation of the substrate. In this case, the liquid on the substrate is directed toward the edge of the substrate or toward the center of the substrate in the diametrical direction of the substrate. That is, the liquid on the substrate is shaken in the diametrical direction of the substrate. Accordingly, the first organic solvent is easily replaced with the second organic solvent. In particular, when the substrate has patterns formed thereon, the first organic solvent that has entered the gap between the patterns is mixed with the second organic solvent in the gap and is easily removed from the gap. Thus, the first organic solvent can be removed from the substrate effectively.

Example 5. In the method of Example 4, the forming of the liquid film of the second organic solvent may include increasing a supply amount of the second organic solvent to the substrate when the substrate is rotated at a low speed. In this case, when the substrate is rotated at a low speed, a liquid puddle of the second organic solvent is formed on the surface of the substrate. Accordingly, when the rotation speed of the substrate is accelerated thereafter, the liquid puddle having a relatively large mass is moved toward the edge of the substrate in a lumpy state. At this time, the liquid on the substrate is also moved to the edge of the substrate by being drawn by the liquid puddle in the form of a lump. In particular, when the substrate has the patterns formed thereon, the first organic solvent that has entered the gap between the patterns is drawn outwards from the gap by the movement of the liquid puddle in the form of the lump. Accordingly, it becomes possible to effectively remove the first organic solvent from the substrate.

Example 6. The method of Examples 1 to 5 may further include forming, by supplying a third organic solvent to the substrate while rotating the substrate, a liquid film of the third organic solvent on the substrate and removing the second organic solvent from the substrate, after the forming of the liquid film of the second organic solvent and before the drying of the substrate. The third organic solvent may have water solubility lower than that of the first organic solvent and a boiling point higher than that of the second organic solvent. In this case, the third organic solvent is supplied after the second organic solvent is supplied. Since the third organic solvent has lower water solubility than the second organic solvent, it is more difficult for the third organic solvent to include moisture in the air. For this reason, if the substrate is dried after replacing the second organic solvent with the third organic solvent, it becomes very difficult for the moisture to remain on the substrate. Further, since the third organic solvent has a higher boiling point than that of the second organic solvent, it is more difficult for the third organic solvent to vaporize. For this reason, the temperature decrease of the substrate is very difficult to occur. Therefore, the condensation and the absorption of the moisture in the atmosphere are suppressed without needing to add the heating source and the moisture absorbing device. As a result, the formation of the water marks can be further suppressed while suppressing the cost of substrate processing.

Example 7. In the method of Example 6, a solubility parameter (SP value) of the third organic solvent may be smaller than a solubility parameter (SP value) of the second organic solvent. In this case, the third organic solvent is easily dissolved in the second organic solvent. For this reason, if the third organic solvent is supplied to the substrate, the second organic solvent is mixed with the third organic solvent and is removed from the substrate, making it difficult for the second organic solvent to remain on the substrate. As a result, the formation of the water marks can be further suppressed especially when pure water is used as the rinse liquid.

Example 8. In the method of Example 6 or 7, the third organic solvent may be a mixed solution in which multiple kinds of organic solvents are mixed. In this case, a parameter such as a boiling point can be easily adjusted by mixing the multiple organic solvents having different water solubility, for example.

Example 9. In the method of any one of Examples 6 to 8, the forming of the liquid film of the third organic solvent may include supplying the third organic solvent to the substrate while repeating acceleration and deceleration of a rotation of the substrate. In this case, the as in Example 4, the liquid on the substrate is shaken in the diametrical direction of the substrate. Accordingly, the second organic solvent is easily replaced by the third organic solvent. In particular, when the substrate has the patterns formed thereon, the second organic solvent that has entered the gap between the patterns is mixed with the third organic solvent in the gap and is easily removed from the gap. Therefore, it becomes possible to effectively remove the second organic solvent from the substrate.

Example 10. In the method of Example 9, a maximum rotation speed of the substrate in the forming of the liquid film of the third organic solvent may be larger than a maximum rotation speed of the substrate in the forming of the liquid film of the second organic solvent. In this case, since the larger centrifugal force is applied to the third organic solvent, the replacement of the second organic solvent with the third organic solvent can be accelerated.

Example 11. In the method of Example 9 or 10, the forming of the liquid film of the third organic solvent may include increasing a supply amount of the third organic solvent to the substrate when the substrate is rotated at a low speed. In this case, the same as in Example 5, the liquid on the substrate is moved to the edge of the substrate by being drawn by the liquid puddle in the form of the lump. In particular, when the substrate has the patterns, the second organic solvent that has entered the gap between the patterns is pulled outwards from the gap by the movement of the liquid puddle in the form of the lump. Accordingly, it becomes possible to effectively remove the second organic solvent from the substrate.

Example 12. An example of a substrate processing apparatus may include a rotating/holding unit configured to hold and rotate a substrate; a cleaning liquid supply configured to supply a cleaning liquid to the substrate; a rinse liquid supply configured to supply a rinse liquid to the substrate; a first solvent supply configured to supply a first organic solvent to the substrate; a second solvent supply configured to supply a second organic solvent to the substrate; and a controller. The second organic solvent may have water solubility lower than that of the first organic solvent and a boiling point higher than that of the first organic solvent. The controller may be configured to perform: forming, during a rotation of the substrate with the rotating/holding unit, a liquid film of the cleaning liquid on the substrate by controlling the rotating/holding unit and the cleaning liquid supply; removing, after the forming of the liquid film of the cleaning liquid, the cleaning liquid from the substrate and forming a liquid film of the rinse liquid on the substrate during the rotation of the substrate with the rotating/holding unit by controlling the rotating/holding unit and the rinse liquid supply; removing, after the removing of the cleaning liquid, the rinse liquid from the substrate and forming a liquid film of the first organic solvent on the substrate during the rotation of the substrate with the rotating/holding unit by controlling the rotating/holding unit and the first solvent supply; removing, after the removing of the rinse liquid, the first organic solvent from the substrate and forming a liquid film of the second organic solvent on the substrate during the rotation of the substrate with the rotating/holding unit by controlling the rotating/holding unit and the second solvent supply; and drying the substrate by controlling the rotating/holding unit after the removing of the first organic solvent. The same effect as in the method of Example 1 is obtained.

Example 13. In the apparatus of Example 12, a solubility parameter (SP value) of the first organic solvent may be smaller than a solubility parameter (SP value) of the rinse liquid, and a solubility parameter (SP value) of the second organic solvent may be smaller than the solubility parameter (SP value) of the first organic solvent. In this case, the same effect as in the method of Example 2 is obtained.

Example 14. In the apparatus of Example 12 or 13, the second organic solvent may be a mixed solution in which multiple kinds of organic solvents are mixed. In this case, the same effect as the method of Example 3 is obtained.

Example 15. In the apparatus of any one of Examples 12 to 14, the removing of the first organic solvent may include supplying the second organic solvent to the substrate by the second solvent supply while repeating acceleration and deceleration of the rotation of the substrate by the rotating/holding unit. In this case, the same effect as in the method of Example 4 is obtained.

Example 16. In the apparatus of Example 15, the removing of the first organic solvent may include increasing a supply amount of the second organic solvent by the second solvent supply when the substrate is rotated at a low speed. In this case, the same effect as in the method of Example 5 is obtained.

Example 17. The apparatus of any one of examples 12 to 16 may further include a third solvent supply configured to supply a third organic solvent to the substrate. The third organic solvent may have water solubility lower than that of the first organic solvent and a boiling point higher than that of the second organic solvent. The controller may be configured to further perform removing, after the removing of the first organic solvent and before the drying of the substrate, the second organic solvent from the substrate and forming a liquid film of the third organic solvent on the substrate during the rotation of the substrate with the rotating/holding unit by controlling the rotating/holding unit and the third solvent supply. In this case, the same effect as in the method of Example 6 is obtained.

Example 18. In the apparatus of Example 17, a solubility parameter (SP value) of the third organic solvent may be smaller than a solubility parameter (SP value) of the second organic solvent. In this case, the same effect as in the method of Example 7 is obtained.

Example 19. In the apparatus of Example 17 or 18, the third organic solvent may be a mixed solution in which multiple kinds of organic solvents are mixed. In this case, the same effect as in the method of Example 8 is obtained.

Example 20. In the apparatus of any one of Examples 17 to 19, the removing of the second organic solvent may include supplying the third organic solvent to the substrate by the third solvent supply while repeating acceleration and deceleration of the rotation of the substrate by the rotating/holding unit. In this case, the same effect as in the method of Example 9 is obtained.

Example 21. In the apparatus of Example 20, a maximum rotation speed of the substrate in the removing of the second organic solvent may be larger than a maximum rotation speed of the substrate in the removing of the first organic solvent. In this case, the same effect as the method of Example 10 is obtained.

Example 22. In the apparatus of Example 20 or 21, the removing of the second organic solvent may include increasing a supply amount of the third organic solvent by the third solvent supply when the substrate is rotated at a low speed. In this case, the same effect as the method of Example 11 is obtained.

Example 23. An example of a computer-readable recording medium may have stored thereon computer-executable instructions that, in response to execution, cause a substrate processing apparatus to perform a method of any one of Examples 1 to 11. In this case, the same effect as in the method of Example 1 is obtained. In the present specification, the computer-readable recording medium may include a non-transitory computer recording medium (for example, various types of main storage devices or auxiliary storage devices) or radio signals (transitory computer recording medium) (for example, data signals that can be provided via a network).

According to the substrate processing method, the substrate processing apparatus, and the computer-readable recording medium of the exemplary embodiments, it is possible to suppress the formation of the watermark while suppressing the cost of the substrate processing.

I claim:

1. A substate processing method, comprising:
  forming, by supplying a cleaning liquid to a substrate while rotating the substrate, a liquid film of the cleaning liquid on the substrate;
  forming, by supplying a rinse liquid to the substrate while rotating the substrate, a liquid film of the rinse liquid on the substrate and removing the cleaning liquid from the substrate, after the forming of the liquid film of the cleaning liquid;
  forming, by supplying a first organic solvent to the substrate while rotating the substrate, a liquid film of the first organic solvent on the substrate and removing the rinse liquid from the substrate, after the forming of the liquid film of the rinse liquid;
  forming, by supplying a second organic solvent to the substrate while rotating the substrate, a liquid film of the second organic solvent on the substrate and removing the first organic solvent from the substrate, after the forming of the liquid film of the first organic solvent;
  forming, by supplying a third organic solvent to the substrate while rotating the substrate, a liquid film of the third organic solvent on the substrate and removing the second organic solvent from the substrate, after the forming of the liquid film of the second organic solvent; and drying the substrate after the forming of the liquid film of the third organic solvent, wherein the substrate is dried without performing any additional organic-solvent supplying step between the forming of the liquid film of the third organic solvent and the drying of the substrate, wherein the second organic solvent has water solubility lower than that of the first organic solvent and a boiling point higher than that of the first organic solvent, the third organic solvent has water solubility lower than that of the second organic solvent and a boiling point higher than that of the second organic solvent, a solubility parameter (SP value) of the first organic solvent is smaller than a solubility parameter (SP value) of the rinse liquid, and a solubility parameter (SP value) of the second organic solvent is smaller than the solubility parameter (SP value) of the first organic solvent.

2. The substrate processing method of claim 1, wherein the rinse liquid is pure water.

3. The substrate processing method of claim 1, wherein the second organic solvent is a mixed solution in which multiple kinds of organic solvents are mixed.

4. The substrate processing method of claim 1, wherein the forming of the liquid film of the second organic solvent comprises supplying the second organic solvent to the substrate while repeating acceleration and deceleration of a rotation of the substrate.

5. The substrate processing method of claim 4, wherein the forming of the liquid film of the second organic solvent comprises increasing a supply amount of the second organic solvent to the substrate when the substrate is rotated.

6. The substrate processing method of claim 1, wherein a solubility parameter (SP value) of the third organic solvent is smaller than a solubility parameter (SP value) of the second organic solvent.

7. The substrate processing method of claim 1, wherein the third organic solvent is a mixed solution in which multiple kinds of organic solvents are mixed.

8. The substrate processing method of claim 1, wherein the forming of the liquid film of the third organic solvent comprises supplying the third organic solvent to the substrate while repeating acceleration and deceleration of a rotation of the substrate.

9. The substrate processing method of claim 8, wherein a maximum rotation speed of the substrate in the forming of the liquid film of the third organic solvent is larger than a maximum rotation speed of the substrate in the forming of the liquid film of the second organic solvent.

10. The substrate processing method of claim 8, wherein the forming of the liquid film of the third organic solvent comprises increasing a supply amount of the third organic solvent to the substate when the substrate is rotated.

11. A substrate processing apparatus, comprising:

a rotating/holding unit configured to hold and rotate a substrate;

a cleaning liquid supply configured to supply a cleaning liquid to the substrate, wherein the cleaning liquid supply comprises a cleaning liquid source that contains the cleaning liquid;

a rinse liquid supply configured to supply a rinse liquid to the substrate, wherein the rinse liquid supply comprises a rinse liquid source that contains the rinse liquid;

a first solvent supply configured to supply a first organic solvent to the substrate, wherein the first solvent supply comprises a first solvent source that contains the first organic solvent;

a second solvent supply configured to supply a second organic solvent to the substrate, wherein the second solvent supply comprises a second solvent source that contains the second organic solvent;

a third solvent supply configured to supply a third organic solvent to the substrate, wherein the third solvent supply comprises a third solvent source that contains the third organic solvent; and a controller configured to control the rotating/holding unit, the cleaning liquid supply, the rinse liquid supply, the first solvent supply, the second solvent supply, and the third solvent supply, wherein the second organic solvent has water solubility lower than that of the first organic solvent and a boiling point higher than that of the first organic solvent, the third organic solvent has water solubility lower than that of the second organic solvent and a boiling point higher than that of the second organic solvent, a solubility parameter (SP value) of the first organic solvent is smaller than a solubility parameter (SP value) of the rinse liquid, a solubility parameter (SP value) of the second organic solvent is smaller than the solubility parameter (SP value) of the first organic solvent, and wherein the controller is configured to perform:

forming, during a rotation of the substrate with the rotating/holding unit, a liquid film of the cleaning liquid on the substrate by controlling the rotating/holding unit and the cleaning liquid supply;

removing, after the forming of the liquid film of the cleaning liquid, the cleaning liquid from the substrate and forming a liquid film of the rinse liquid on the substrate during the rotation of the substrate with the rotating/holding unit by controlling the rotating/holding unit and the rinse liquid supply;

removing, after the removing of the cleaning liquid, the rinse liquid from the substrate and forming a liquid film of the first organic solvent on the substrate during the rotation of the substrate with the rotating/holding unit by controlling the rotating/holding unit and the first solvent supply;

removing, after the removing of the rinse liquid, the first organic solvent from the substrate and forming a liquid film of the second organic solvent on the substrate during the rotation of the substrate with the rotating/holding unit by controlling the rotating/holding unit and the second solvent supply;

removing, after the removing of the first organic solvent, the second organic solvent from the substrate and forming a liquid film of the third organic solvent on the substate during the rotation of the substrate with the rotating/holding unit by controlling the rotating/holding unit and the third solvent supply; and drying the substrate after the forming of the liquid film of the third organic solvent, wherein the drying is performed without the controller performing any additional organic-solvent supplying step between the forming of the liquid film of the third organic solvent and the drying of the substrate.

12. The substrate processing apparatus of claim 11, wherein the rinse liquid is pure water.

13. The substrate processing apparatus of claim 11, wherein the second organic solvent is a mixed solution in which multiple kinds of organic solvents are mixed.

14. The substrate processing apparatus of claim 11, wherein the third organic solvent is a mixed solution in which multiple kinds of organic solvents are mixed.

15. The substrate processing apparatus of claim 11, wherein the removing of the second organic solvent comprises supplying the third organic solvent to the substrate by the third solvent supply while repeating acceleration and deceleration of the rotation of the substrate by the rotating/holding unit.

16. The substrate processing apparatus of claim 15, wherein a maximum rotation speed of the substrate in the removing of the second organic solvent is larger than a maximum rotation speed of the substrate in the removing of the first organic solvent.

17. The substrate processing apparatus of claim 15, wherein the removing of the second organic solvent comprises increasing a supply amount of the third organic solvent by the third solvent supply when the substrate is rotated.

18. A computer-readable recording medium having stored thereon computer-executable instructions that, in response to execution, cause a substrate processing apparatus to perform a substrate processing method as claimed in claim 1.

\*　\*　\*　\*　\*